United States Patent
McElvain et al.

(10) Patent No.: US 7,263,673 B1
(45) Date of Patent: Aug. 28, 2007

(54) METHOD AND APPARATUS FOR AUTOMATED SYNTHESIS AND OPTIMIZATION OF DATAPATHS

(75) Inventors: Kenneth S. McElvain, Los Altos, CA (US); David Rickel, Sunnyvale, CA (US)

(73) Assignee: Synplicity, Inc., Sunnyvale, CA (US)

( * ) Notice: Subject to any disclaimer, the term of this patent is extended or adjusted under 35 U.S.C. 154(b) by 374 days.

(21) Appl. No.: 10/911,317

(22) Filed: Aug. 3, 2004

Related U.S. Application Data

(60) Provisional application No. 60/530,108, filed on Dec. 15, 2003.

(51) Int. Cl.
*G06F 17/50* (2006.01)
(52) U.S. Cl. .......................................................... 716/3
(58) Field of Classification Search ...................... 716/3
See application file for complete search history.

(56) References Cited

U.S. PATENT DOCUMENTS

| | | | |
|---|---|---|---|
| 6,772,399 B2* | 8/2004 | Saluja et al. | 716/2 |
| 6,785,872 B2* | 8/2004 | Carter | 716/3 |

OTHER PUBLICATIONS

Kim et al., "Circuit Optimization Using Carry-Save-Adder Cells", IEEE Transactions on Computer-Aided Design of Integrated Circuits and Systems, Vol. 17, No. 10, Oct. 1998.*

Signal Representation Guided Synthesis Using Carry-Save Adders For Synchronous Data-path Circuits, by Zhan Yu, et al.
Arithmetic Optimization Using Carry-Save-Adders, by Taewhan Kim, et al.
Quantum Carry-Save Arithmetic, by Phil Gossett, Aug. 29, 1998.

* cited by examiner

*Primary Examiner*—Jack Chiang
*Assistant Examiner*—Brandon Bowers
(74) *Attorney, Agent, or Firm*—Blakely, Sokoloff, Taylor & Zafman LLP

(57) ABSTRACT

Methods and apparatuses for automated synthesis transformation for carry save optimization and/or for the correction of dropped truncation after widening an adder. In one embodiment of the present invention, a correction input is automatically generated for a widened adder to correct the dropping or truncation of result bits that is performed by the adder before the widening. In one example the dropped result bits are part of the user's HDL specification. In another example the carry save optimization is enabled by a retiming operation. In one embodiment of the present invention, one or more logic operators between adders are pushed (e.g., forward or backward) across at least one of the adders so that the adders can be collapsed for carry save optimization. In one embodiment, an adder followed by a comparator is transformed to use a carry save adder followed by a comparator so that the carry chain in the original adder can be eliminated.

45 Claims, 18 Drawing Sheets

| Mod(a[7]+b[7],2) | $C_{out}$ of a[6:0]+b[6:0] ||
|---|---|---|
| | 0 | 1 |
| 0 | 0 | 0 |
| 1 | +1 | -1 |

| xor(a[7], b[7]) | $C_{out}$ of a[6:0]+b[6:0] ||
|---|---|---|
| | 0 | 1 |
| 0 | 000 | 000 |
| 1 | 001 | 111 |

Fig. 4

| Mod(a[7]+b[7],2) | $C_{out}$ of a[6:0]+b[6:0] ||
|---|---|---|
| | 0 | 1 |
| 0 | 0 | -2 |
| 1 | -1 | -1 |

336

| xor(a[7], b[7]) | $C_{out}$ of a[6:0]+b[6:0] ||
|---|---|---|
| | 0 | 1 |
| 0 | 000 | 110 |
| 1 | 111 | 111 |

METHOD AND APPARATUS FOR AUTOMATED SYNTHESIS AND OPTIMIZATION OF DATAPATHS

This application is related to and claims the benefit of the filing date of U.S. provisional application Ser. No. 60/530,108, filed Dec. 15, 2003, and entitled "Method and Apparatus for Automated Synthesis and Optimization of Datapaths" by the inventors Kenneth S. McElvain and David Rickel.

FIELD OF THE TECHNOLOGY

The invention relates to the automated design of digital circuits, and more particularly to the automated synthesis optimization with adders.

BACKGROUND

For the design of digital circuits (e.g., on the scale of Very Large Scale Integration (VLSI) technology), designers often employ computer-aided techniques. Standard languages such as Hardware Description Languages (HDLs) have been developed to describe digital circuits to aid in the design and simulation of complex digital circuits. Several hardware description languages, such as VHDL and Verilog, have evolved as industry standards. VHDL and Verilog are general-purpose hardware description languages that allow definition of a hardware model at the gate level, the register transfer level (RTL) or the behavioral level using abstract data types. As device technology continues to advance, various product design tools have been developed to adapt HDLs for use with newer devices and design styles. Other languages such as variations of C and C++ can also be used as hardware description languages.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). For the purpose of this description there are other equivalent data structures. One example is a control data flow graph (CDFG). A mapping operation is then performed to convert from the technology independent RTL netlist to a technology specific netlist, which can be used to create circuits in the vendor's technology/architecture. It is well known that FPGA vendors utilize different technology/architecture to implement logic circuits within their integrated circuits. Thus, the technology independent RTL netlist is mapped to create a netlist, which is specific to a particular vendor's technology/architecture.

In designing a circuit, transformations are frequently performed to optimize certain design goals. For example, transformations may be performed to reduce the area used by a circuit or to increase the speed of the circuit.

SUMMARY OF THE DESCRIPTION

Methods and apparatuses for automated synthesis transformation for carry save optimization and/or for the correction of dropped truncation after widening an adder are described here. Some embodiments are summarized in this section.

In one embodiment of the present invention, a correction input is automatically generated for a widened adder to correct the dropping or truncation of result bits that is performed by the adder before the widening. In one example the dropped result bits are part of the user's HDL specification. In another example the carry save optimization is enabled by a retiming operation. In one embodiment of the present invention, one or more logic operators between adders are pushed (e.g., forward or backward) across at least one of the adders so that the adders can be collapsed for carry save optimization. In one embodiment, an adder followed by a comparator is transformed to use a carry save adder followed by a comparator so that the carry chain in the original adder can be eliminated.

In one aspect of the present invention, a machine implemented method of automated design of a circuit, includes: performing a synthesis transformation on a hardware design language (HDL) representation of a circuit to widen an adder; and determining whether or not the widened adder drops any truncation that is performed before the adder is widened. In one example of an embodiment, a correction input is automatically generated to correct dropping of truncation in the widened adder. In one example of an embodiment, the synthesis transformation includes: pushing a logic operator backward through the adder. In one example of an embodiment, the synthesis transformation includes: transforming the adder into a carry save adder in combination with a down stream adder. In one example of embodiment, the synthesis transformation includes: combining the adder with a down stream element to generate a carry save adder to eliminate at least one carry chain. For example, the down stream element may be an adder, a comparator, or an adder/subtractor. An adder/subtractor selectively adds or subtracts according to a control signal. In one example of an embodiment, the synthesis transformation further includes: transforming a multiplier to generate the adder. In one example of an embodiment, the synthesis transformation further includes: pushing an logic operator from between the adder and the down stream element to outside a path between the adder and the down stream element.

In one aspect of the present invention, a machine implemented method of automated design of a circuit, includes: receiving a hardware design language (HDL) representation of a circuit, which has a first adder followed by a first comparator; and transforming the HDL representation of the circuit to replace the first adder and the first comparator with a second carry save adder and a second comparator driven by two outputs of the second carry save adder. In one example of an embodiment, the second comparator is the same as the first comparator. In one example of an embodiment, the method further includes: pushing a logic operator from between the first adder and the first comparator to outside the first adder and the first comparator. In one example of an embodiment, the method further includes: determining whether or not the second carry save adder drops any truncation that is performed before said transforming; and automatically generating a correction input to correct dropping of truncation in the second carry save adder. In one example of an embodiment, the method further includes: automatically generating a circuit to compute a correction as an input for the second carry save adder to correct dropping of truncation; where the first adder has a first width; the second carry save adder has a second width; the first width is smaller than the second width; and the correction corrects the dropping of truncation caused by promoting inputs for the first adder of the first width to inputs for the second carry save adder of the second width.

In one aspect of the present invention, a machine implemented method of automated design of a circuit in a hardware design language (HDL) representation, includes: transforming a portion of a circuit from a first design to a second design containing a carry save adder to eliminate at least one carry chain; and automatically generating a correction circuit to compute a correction for the carry save adder in the second design to maintain equivalence between the first design of the portion of the circuit and the second design of the portion of the circuit. In one example of an embodiment, the first design includes a first adder of a first width; the carry save adder has a second width; the first width is smaller than the second width; the correction corrects dropping of truncation caused by promoting inputs for the first adder of the first width to inputs for the carry save adder of the second width; for example, the correction corrects dropping of truncation of summing two signed or unsigned integers. In one example of an embodiment, the first design includes a first element connected to a second element; the first element has one carry chain, the second element has one carry chain; the second design element uses the carry save adder to eliminate at least one of the carry chain of the first element and the carry chain of the second element; and the correction circuit combines a portion of inputs for the first element to compute the correct as an input for the carry save adder.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

FIG. 4 shows truth tables for the dropped bit correction in adding two unsigned integers according to one embodiment of the present invention.

FIG. 6 shows truth tables for the dropped bit correction in adding two signed integers according to one embodiment of the present invention.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present disclosure are not necessarily references to the same embodiment; and, such references mean at least one.

At least one embodiment of the present invention seeks to optimize a circuit design through automated transformation so that carry save techniques can be used in generating an improved and equivalent circuit. Examples and details are described below.

Many of the methods of the present invention may be performed with a digital processing system, such as a conventional, general-purpose computer system. Special purpose computers which are designed or programmed to perform only one function may also be used.

Figure 1:
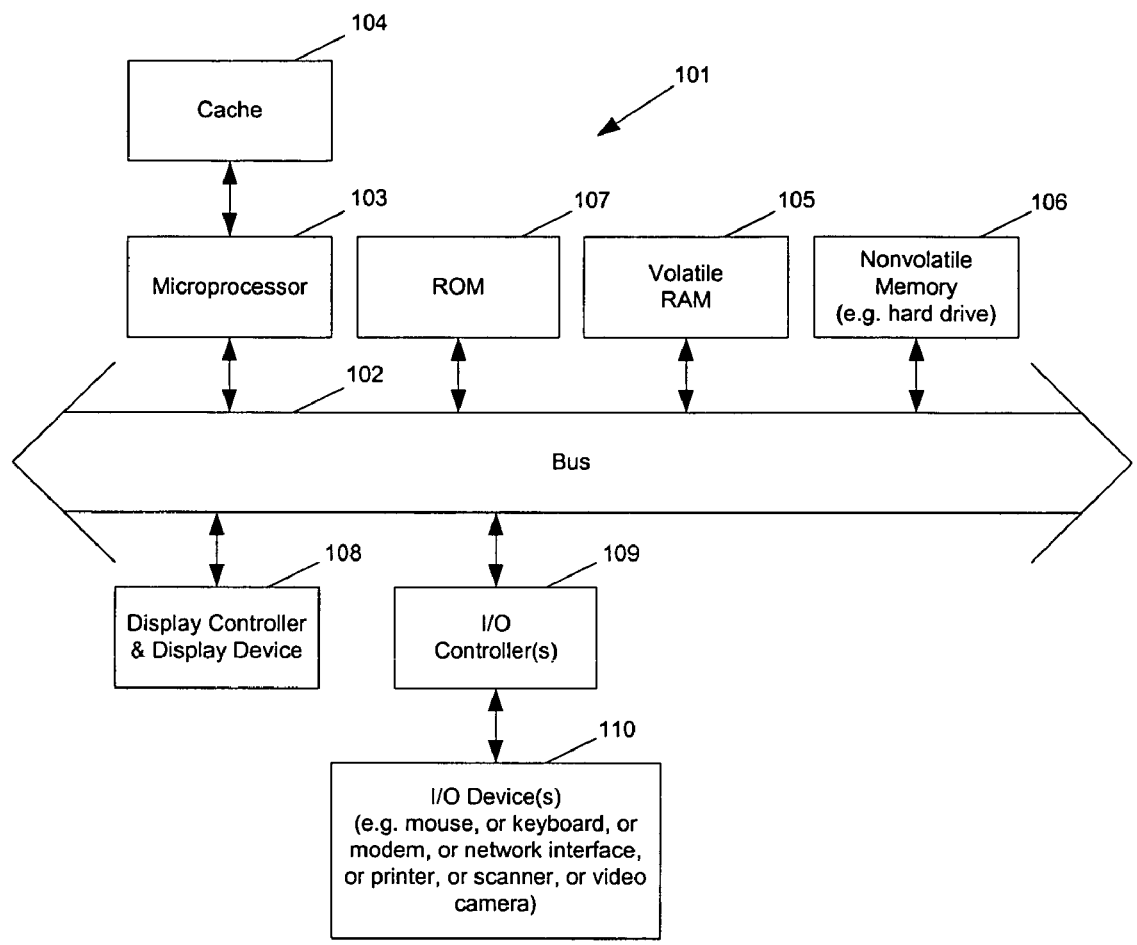
FIG. 1 shows a block diagram example of a data processing system which may be used with the present invention.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be an Apple Macintosh computer, a Sun workstation, or a personal computer (PC) running a Windows operating system.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103, which may be a G3 or G4 microprocessor from Motorola, Inc. or IBM is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

Figure 2:
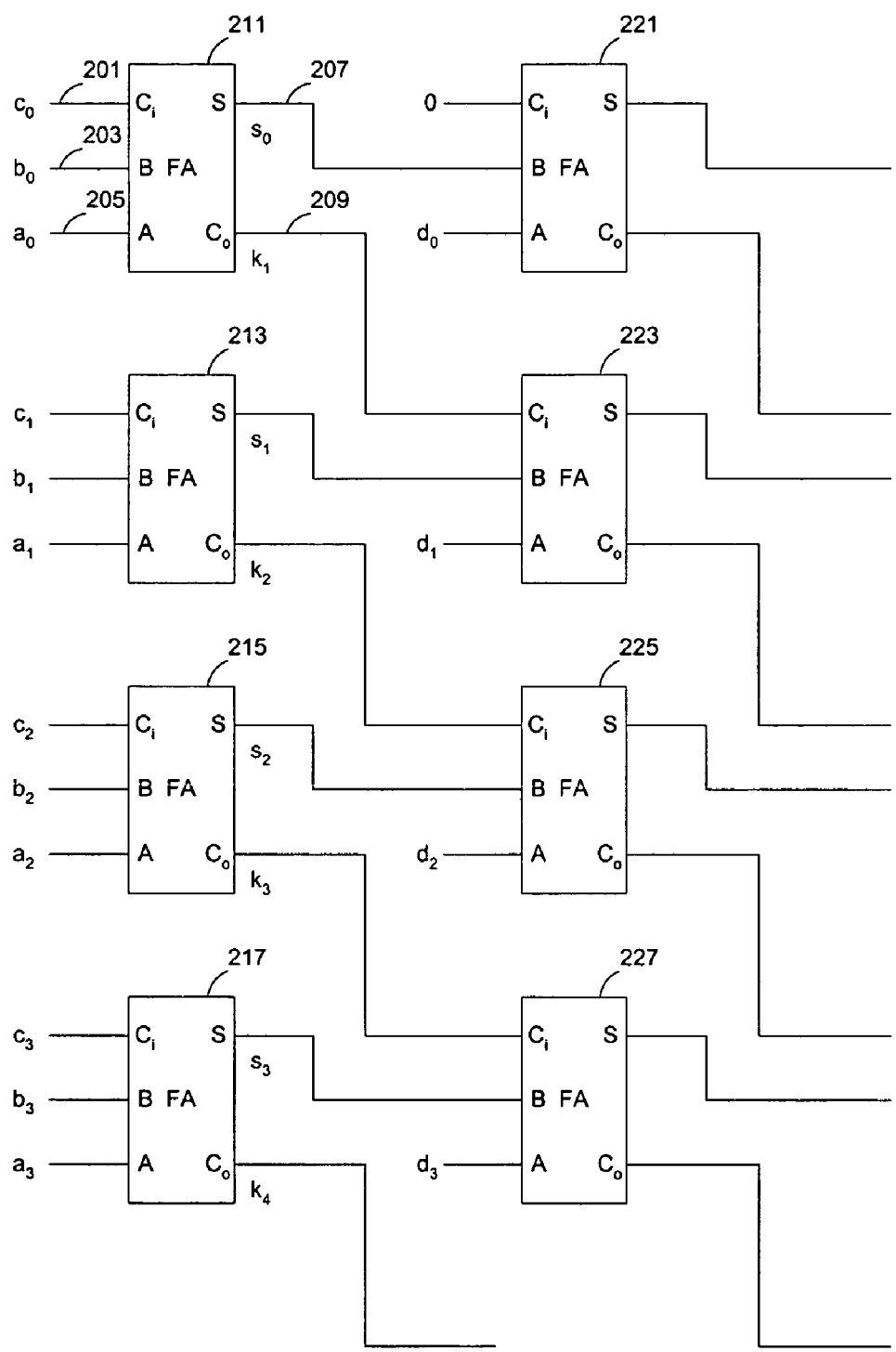
FIG. 2 shows a carry save optimization which may be used in various embodiments of the present invention.

FIG. 2 shows a carry save optimization which may be used in various embodiments of the present invention. In FIG. 2, each of full adders 211, 213, 215 and 217 takes three binary inputs (A, B, $C_i$) to produce a sum bit (S) and a carry out bit ($C_o$). For example, adder 211 sums $c_0$ (201), $b_0$ (203) and $a_0$ (205) to generate $s_0$ (207) and $k_1$ (209) so that $c_0+b_0+a_0=2\times k_1+s_0$. Instead of propagating carry out $k_1$ to the upper bit adder (e.g., 213) through a carry chain (e.g., feeding $C_o$ of 211 into $C_i$ of 213, $C_o$ of 213 into $C_i$ of 215, and $C_o$ of 213 into $C_i$ of 217), the carry out bits are saved for the next operation (e.g., as input for full adders 221, 223, 225, 227) in which the carry out bits are used directly. For example, carry out $k_1$ (209) is added with the sum bit of adder 213 and the corresponding bit $d_1$ of the next operand. Thus, when a set of cascaded carry save adders are used, a number of carry chains can be eliminated. A carry chain is a time-costly operation, since an upper bit adder in the chain needs to wait for the carry out bit output from the lower bit adder in order to produce the correct result. In FIG. 2, the set of disjoint full adders 211-217 reduces three input vectors (e.g., $\{a_0, a_1, a_2, a_3\}$, $\{b_0, b_1, b_2, b_3\}$ and $\{c_0, c_1, c_2, c_3\}$, which may represent three integers) into two vectors, sum vector $\{s_0, s_1, s_2, s_3\}$ and carry out vector $\{k_1, k_2, k_3, k_4\}$. The sum of the binary numbers $\{a_0, a_1, a_2, a_3\}$, $\{b_0, b_1, b_2, b_3\}$ and $\{c_0, c_1, c_2, C_3\}$ is equal to the sum of binary numbers $\{s_0, s_1, s_2, s_3\}$ and $\{0, k_1, k_2, k_3\}$. The carry save adder saves the carry vector instead of propagating the carry bits. Thus, the carry save adder is faster than an adder with a carry propagation chain. Two or more consecutive adders can be optimized using a cascaded carry save adders so that only one carry chain is used to propagate the carry bits.

Figure 3:
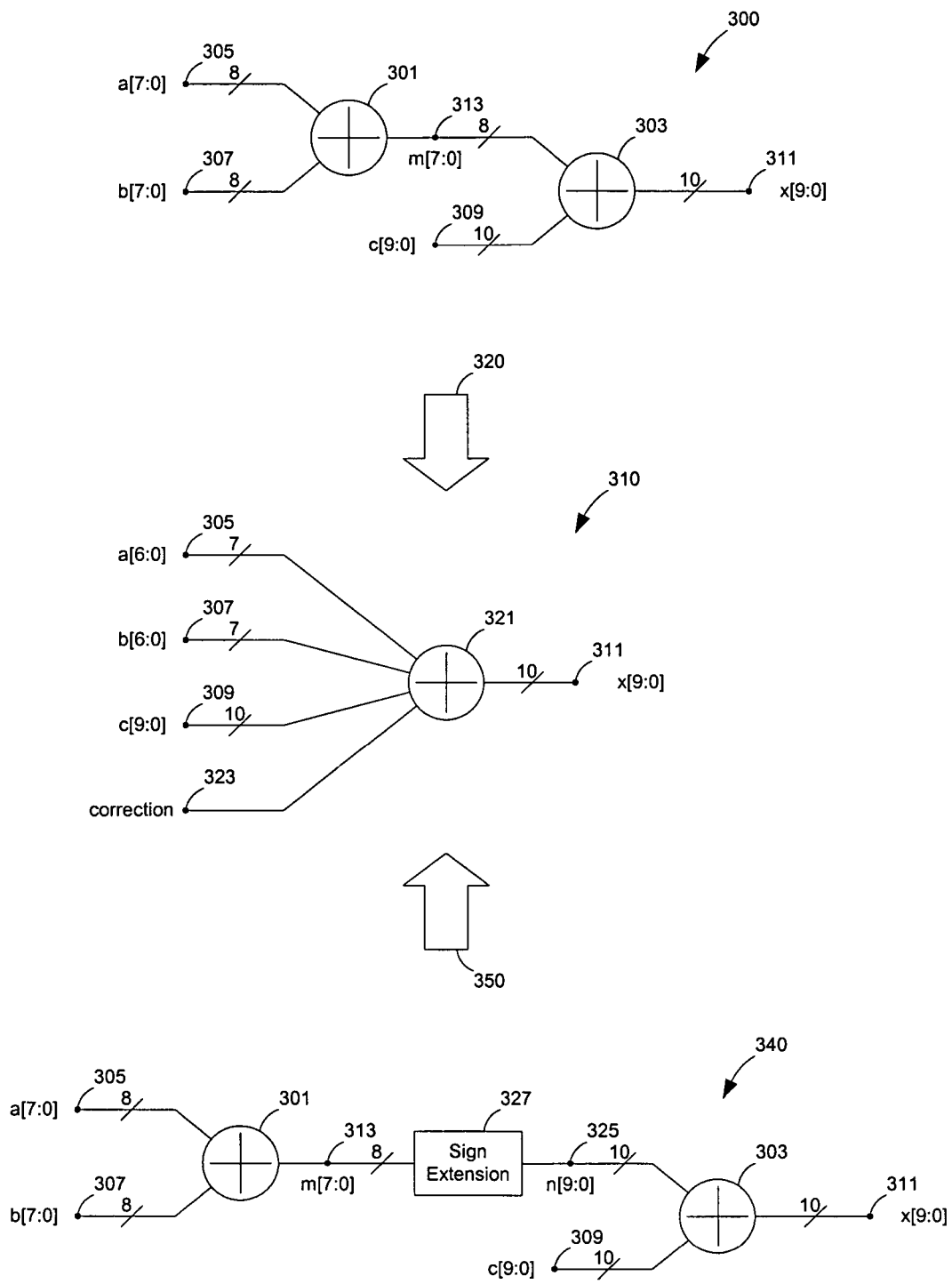
FIG. 3 shows synthesis transformations to use carry save adder according to one embodiment of the present invention.

FIG. 3 shows synthesis transformations to use carry save adder according to one embodiment of the present invention. In FIG. 3, circuit 300 contains adder 301 and adder 303. Adder 301 sums eight-bit input a[7:0] (305) and b[7:0] (307) to generate eight-bit intermediate result m[7:0] (313), which is further added up with ten-bit input c[9:0] (309) by adder 303 to generate ten-bit output x[9:0] (311). In circuit 300, each of adders 301 and 303 requires a carry chain to obtain the corresponding outputs (e.g., m[7:0] and x[9:0]). To obtain a faster version of circuit 300, synthesis transformation 320 is applied on circuit 300 to collapse adders 301 and 303 into a single adder 321, which can be implemented using carry save adders. After synthesis transformation 320 collapses adders 301 and 303 into the single adder 321 of circuit 310, adder 321 can be implemented using carry save adders to have only one carry chain, resulting a faster circuit 310 than circuit 300. However, in general, the summation of two eight-bit number may become a nine-bit number, the eight-bit intermediate result m[7:0] (313) may be a truncated result of the summation of inputs a[7:0] and b[7:0] (e.g., dropping bit m[8], or the carry out of the summation). Since output x[9:0] is wider than intermediate result m[7:0], the truncated bit of adder 301 would propagated through adder 321 if not corrected. In other word, the truncation of adder 301 is dropped in adder 321 if not corrected. Thus, correction input 323 is used to correct the dropped truncation in adder 321 based on a[7:0] and b[7:0] so that circuit 321 is equivalent to circuit 300 in function for all possible input values. Adder 321 can be implemented using one or more carry save adders each of which reduces 3 inputs to 2 outputs (e.g., using disjoint full adders 211-217 as illustrated in FIG. 2). Alternatively, higher orders of reduction can also be used. For example, a circuit that reduces 7 inputs of the same significance to 3 output bits could be used instead.

In circuit 340 of FIG. 3, adder 310 sums eight-bit numbers a[7:0] and b[7:0] to produce eight-bit number m[7:0]. Sign extension 327 extends the sign bit m[7] to higher bits to produce ten-bit number n[9:0] where n[9]=n[8]=m[7] and n[7:0]=m[7:0]. Adder 303 sums ten-bit numbers n[9:0] and c[9:0] to produce ten-bit output x[9:0]. Similar to transformation 320, synthesis transformation 350 collapses adders 301, 303 and sign extension 327 of circuit 340 into the single adder 321 of circuit 310 so that adder 321 can be implemented using carry save adders. To provide the equivalence of the function of sign extension 327 and the function of truncation at adder 301, correction input 323 is automatically generated for adder 321 so that circuit 310 and circuit 340 are functionally equivalent for all inputs.

FIG. 4 shows truth tables for the dropped bit correction in adding two unsigned integers according to one embodiment of the present invention. For example, consider the case where inputs a[7:0] (305) and b[7:0] (307) of circuit 330 in FIG. 3 are unsigned integers. The corrections in terms of the number represented by the bits from bit 7 and higher are shown in table 330. The sum of a[6:0]+b[6:0] produces $C_{out}$ at bit 7 in adder 321. The sum of a[7:0]+b[7:0] produces Mod($C_{out}$+a[7]+b[7], 2) at bit 7 in adder 321. Thus, the correction for bit 7 is $2^7 \times$(Mod($C_{out}$+a[7]+b[7], 2)−$C_{out}$). For example, when Mod(a[7]+b[7], 2) is 0 (e.g., a[7]=b[7]=0 or a[7]=b[7]=1), the correction for is $2^7 \times$(Mod($C_{out}$,2)−$C_{out}$)=0. Thus, When Mod(a[7]+b[7], 2) is 0, the correction for bit 7 is 0 regardless whether $C_{out}$ of a[6:0]+b[6:0] is 0 or 1. When Mod(a[7]+b[7], 2) is 1 (e.g., a[7]=1−b[7]=0 or 1−a[7]=b[7]=0), the correction for is $2^7 \times$(Mod($C_{out}$+1, 2)−$C_{out}$). Thus, When Mod(a[7]+b[7], 2) is 1, the correction for bit 7 is $2^7 \times 1$ when $C_{out}$ of a[6:0]+b[6:0] is 0, and $2^7 \times (-1)$ when $C_{out}$ is 1. Note that Mod(a[7]+b[7], 2)=xor(a[7], b[7]).

Table 332 shows the example of correction input for extending eight-bit input for ten-bit adder for unsigned integers. The correction data in terms of bits r[9:7] are: 000 when xor(a[7], b[7])=0; 001 when xor(a[7], b[7])=1 and $C_{out}$ of a[6]+b[6] is 0; and, 111 (which represents −1) when both xor(a[7], b[7]) and $C_{out}$ of a[6]+b[6] are 1. Note that r[6:0]=0.

Figure 5:
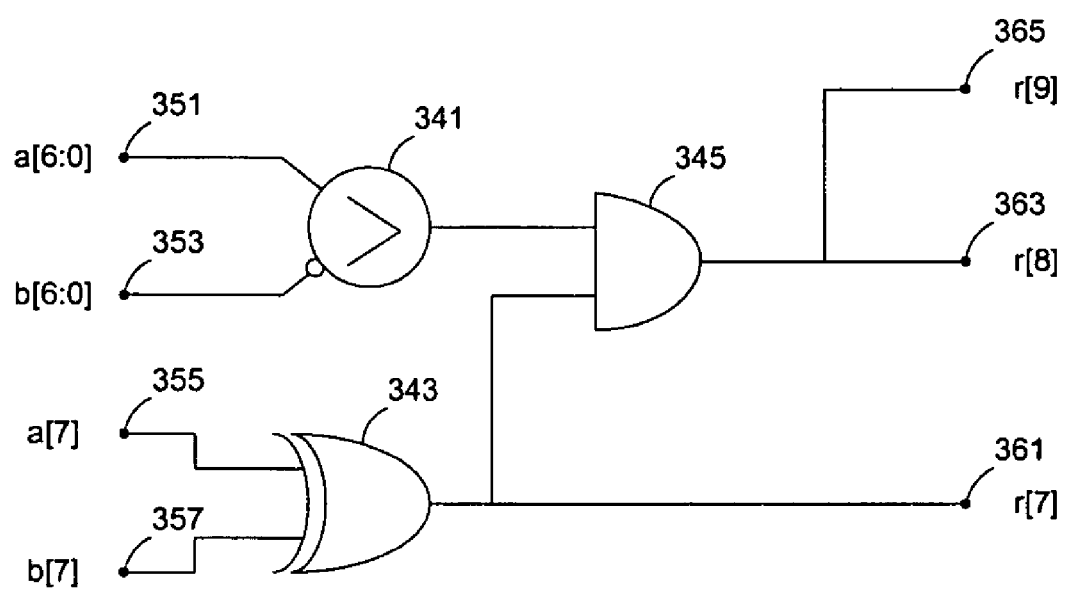
FIG. 5 shows an example circuit for the generation of the dropped bit in adding two unsigned integers according to one embodiment of the present invention.

FIG. 5 shows an example circuit for the generation of the dropped bit in adding two unsigned integers according to one embodiment of the present invention. XOR 343 determines the sum bit of a[7]+b[7], discarding the carry out of a[7]+b[7]. Since the correction input at bit 7 is: 0 when xor(a[7], b[7])=0 and 1 when xor(a[7], b[7])=1, output of XOR 343 can be used as the correction input bit r[7] (361). Comparator 341 determines the carry out of a[6:0]+b[6:0], since the comparator outputs 1 when and only when the carry out of a[6:0]+b[6:0] is 1. AND 345 generates higher bits of the correction input (e.g., r[8] (363), r[9] (365)). When both xor(a[7],b[7]) and $C_{out}$ of a[6:0]+b[6:0] are 1, the correction input is −1, which can be represented as $2^{(k+1)}-1$, where k is the additional bits extended beyond bit 7. Thus, when both xor(a[7], b[7]) and $C_{out}$ of a[6:0]+b[6:0] are 1, AND 345 extends 1 to all additional bits beyond bit 7. When at least one of xor(a[7],b[7]) and $C_{out}$ of a[6:0]+b[6:0] is zero, AND 345 extends 0 to all additional bits beyond bit 7. Thus, the circuit in FIG. 5 generates the correction bits as illustrated in table 332 in FIG. 4.

Although comparator 341 is used in FIG. 5 to extract the carry out bit of a[6:0]+b[6:0], it is understood that other equivalent circuit may also be used.

FIG. 6 shows truth tables for the dropped bit correction in adding two signed integers according to one embodiment of the present invention. For example, consider the case where inputs a[7:0] (305) and b[7:0] (307) of circuit 340 in FIG. 3 are unsigned integers. When the carry out $C_{out}$ of a[6:0]+b[6:0] is 0 and output m[7] of adder 301 of circuit 340 is 0, the correction is 0. When $C_{out}$ of a[6:0]+b[6:0] is 0 and m[7] of adder 301 of circuit 340 is 1, $2^7 \times (-1)$ can be added to adder 321 as correction 323 so that circuit 310 and circuit 340 produce the same result. When $C_{out}$ of a[6:0]+b[6:0] is 1 and m[7] of adder 301 of circuit 340 is 0, $2^7 \times 1$ can be subtracted to produce the same result. When $C_{out}$ of a[6:0]+b[6:0] is 1 and m[7] of adder 301 of circuit 340 is 1, $2^7 \times (-2)$ can be added to produce the same result. Thus, the correction in terms of the number represented by bits 7 and higher (e.g., r[9:7]=$2^{-7} \times$r[9:0] where r[6:0]=0) are as shown in table 336 of FIG. 6.

The correction for transformation 350 can also be viewed as having a component for correcting the dropped truncation of adder 301 in circuit 340 which is the same as the dropped truncation of adder 301 in circuit 340 and a component for the dropped sign extension 327. The dropped sign extension 327 can be corrected by adding $2^7 \times (-2)$ if m[7] of circuit 340 is 1. Note that m[7] of circuit 340 is 1 when Mod($C_{out}$+ a[7]+b[7],2) is 1 and $C_{out}$ is 0, or when Mod($C_{out}$+a[7]+b[7],2) is 0 and $C_{out}$ is 1. Thus, combining the correction for the dropped truncation and the dropped sign extension leads to the correction as shown in table 336 in FIG. 6.

Table 338 shows the example of correction input for extending eight-bit input for ten-bit adder for signed integers. The correction data in terms of bits r[9:7] are: 111 (which represents −1) when xor(a[7], b[7])=1; 110 (which represents −2) when xor(a[7], b[7])=0 and $C_{out}$ of a[6]+b[6] is 1; and, 000 when both xor(a[7], b[7]) and $C_{out}$ of a[6]+b[6] are 0. Note that r[6:0]=0.

Figure 7:
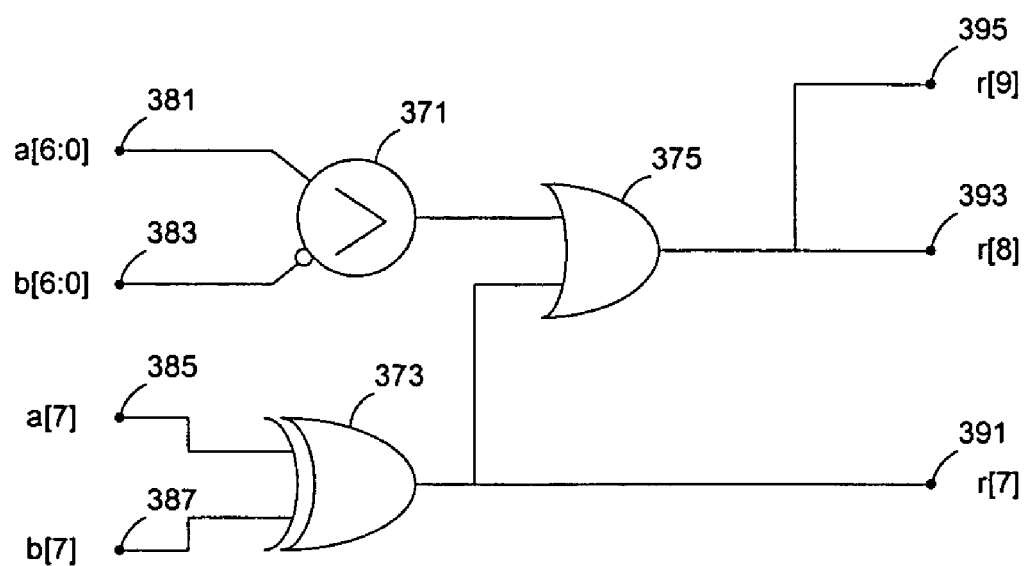
FIG. 7 shows an example circuit for the generation of the dropped bit in adding two signed integers according to one embodiment of the present invention.

FIG. 7 shows an example circuit for the generation of the dropped bit in adding two signed integers according to one embodiment of the present invention. XOR 373 determines the sum bit of a[7]+b[7], discarding the carry out of a[7]+b[7]. Since the correction input at bit 7 is: 0 when xor(a[7], b[7])=0 and 1 when xor(a[7], b[7])=1, output of XOR 373 can be used as the correction input bit r[7] (391). Comparator 371 determines the carry out of a[6:0]+b[6:0], since the comparator outputs 1 when and only when the carry out of a[6:0]+b[6:0] is 1. OR 375 generates higher bits of the correction input (e.g., r[8] (393), r[9] (395)). When both xor(a[7], b[7]) and $C_{out}$ of a[6:0]+b[6:0] are 0, OR 375 generates 0's for all bits higher than bit 7 (e.g., r[9:8]), since the correction input is 0; otherwise, all bits higher than bit 7 are 1's, since the correction input is either −1 or −2.

In FIG. 3, only bits a[6:0] of a[7:0] are directly fed into adder 321. Correction 323 corrects the most significant bit (bit 7) and any higher bits. However, it is understood that alternative arrangement may also be made. For example, a[7:0] may be fed directly into adder 321; and, correction 323 makes the correction accordingly, although such an implementation may not be as efficient at the example as shown in FIG. 3.

Thus, after a correction input is input to the collapsed adder, the resulting circuit (e.g., 310) can be optimized with carry save adders while maintaining functional equivalence to the original circuit (e.g. 300), even though the upper stream adder (e.g., 301) may truncate one or more bits from its output while the down stream adder (e.g., 303) does not automatically truncate at the corresponding bits.

In at least one embodiment of the present invention, a synthesis software program determines if an adder truncates output. When the adder truncates output, correction inputs are added to correct the truncation when the adder is widened (e.g., in collapsing with one or more wider down stream adders for carry save optimization); otherwise, no correction input is necessary.

Figure 8:
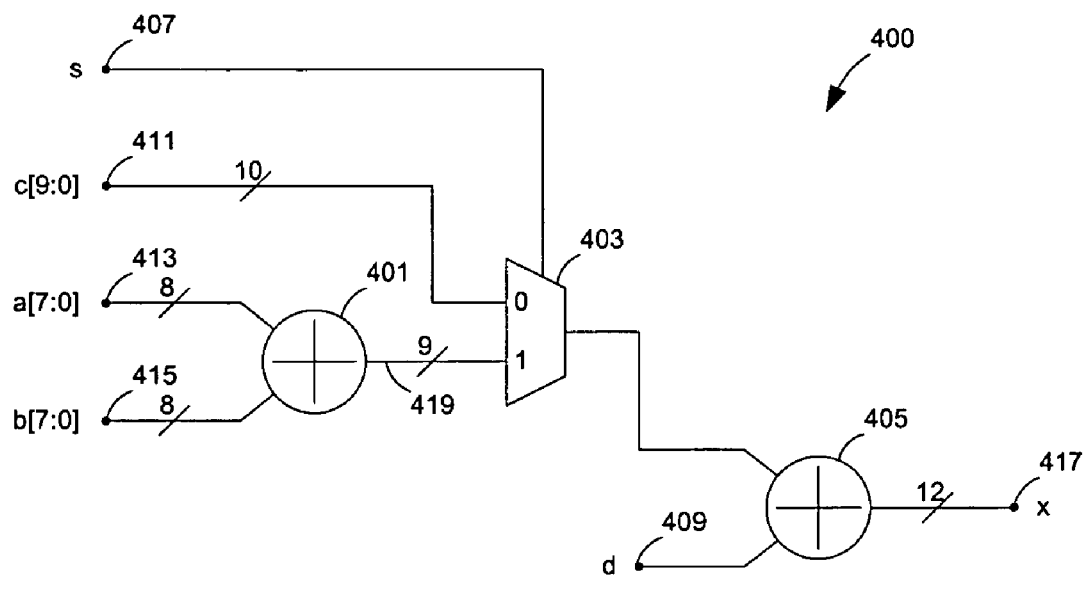
FIG. 8 shows a synthesis transformation of moving a multiplexer backward to allow the collapse of adders for carry save optimization according to one embodiment of the present invention.
Figure 8:
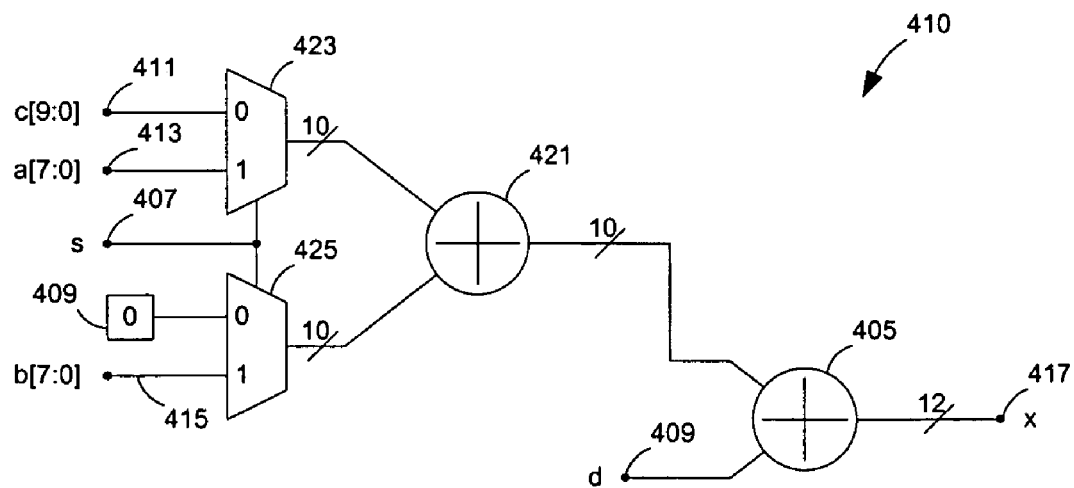

FIG. 8 shows a synthesis transformation of moving a multiplexer backward to allow the collapse of adders for carry save optimization according to one embodiment of the present invention. In FIG. 8, circuit 400 has multiplexer 403 between adders 401 and 405, which prevents the collapsing of adders 401 and 405 into one adder. Synthesis transformation 420 can be applied to move the multiplexer 403 backward to generate circuit 410. In circuit 410, adders 421 and 405 can be collapsed into one single adder so that the carry save optimization can be performed to increase the speed of the circuit. In circuit 400, adder 401 adds two eight-bit input, a[7:0] (413) and b[7:0] (415) to generate a nine-bit output 419. Thus, no truncation is applied. In circuit 410, adder 421 sums two ten-bit inputs to generate a ten-bit output. However, from the transformation of the circuit, it can be determined that adder 421 never truncates the output. Thus, when collapsing adders 421 and 405, it is not necessary to add the correction input. In such a case, if a correction input were added, the correction input would always be zero in all cases.

Although FIG. 8 shows a transformation example of splitting input c[9:0] of circuit 400 into input c[9:0] for multiplexer 423 and 0 for multiplexer 425 in circuit 410, it is understood that various different variations of splitting input c[9:0] of circuit 400 to generate the corresponding inputs for multiplexers 423 and 425 can be used. If the sum of the corresponding inputs for multiplexers 423 and 425 is equal to c[9:0] when s=0, adder 421 produces the same result as multiplexer 403. For example, if c[9:0] is the result of another adder which adds u[9:0] and v[9:0], u[9:0] and v[9:0] can be directly used as input for multiplexers 423 and 425, which are selected when s=0, so that this adder can be eliminated. In FIG. 8, multiplexer 425 and constant 409 can be degenerated as an AND operator under control of s 407.

In one embodiment of the present invention, the synthesis software program keeps track of the information about truncation during the operation like a retiming operation in which an element (e.g., a multiplexer, an AND, an XOR, an OR, or a register) is moved forward or backward across an adder for the determination of whether or not to add a correction input to correct the possible truncation. Note that performing a retiming operation where a register is moved to expose a carry save optimization may also need a dropped result bit correction. Different synthesis transformations can be combined to achieve a CSA reduction. For example, a multiplexer and a register can be moved across an adder to perform a corrected CSA adder collapse. Alternatively, a Boolean analysis can be performed to determine whether or not the inputs of an adder may truncate output. Alternatively, a Boolean analysis can be performed to determine whether or not the correction input for truncation is always a constant (e.g., zero).

Figure 9:
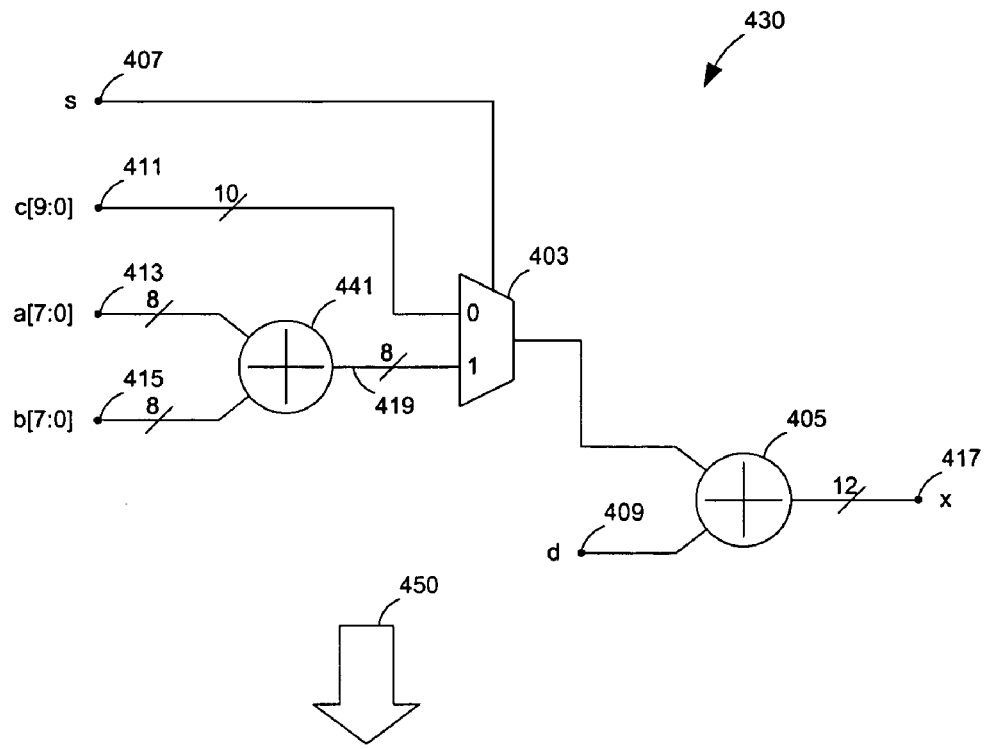
FIG. 9 shows a synthesis transformation of moving a multiplexer forward to allow the collapse of adders for carry save optimization according to one embodiment of the present invention.
Figure 9:
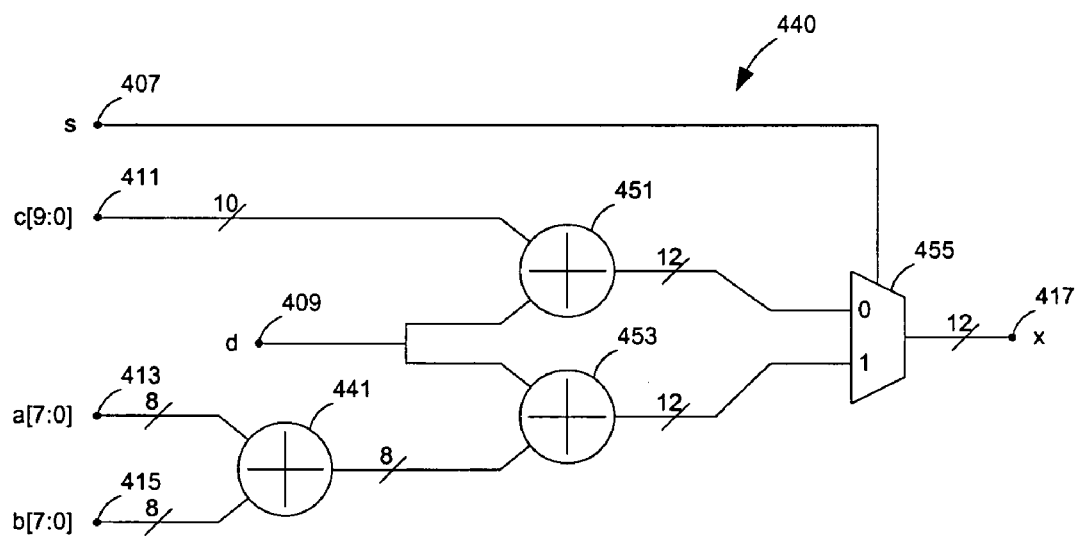

FIG. 9 shows a synthesis transformation of moving a multiplexer forward to allow the collapse of adders for carry save optimization according to one embodiment of the present invention. In FIG. 9, transformation 450 moves multiplexer 403 from between adders 441 and 405 in circuit 403 to after adders 451 and 453 in circuit 440. After the transformation 450, adders 441 and 453 can be collapsed into one adder for carry save optimization. In FIG. 9, adder 441 may truncate its output. Thus, correction inputs can be added to correct the dropped truncation after the collapsing of adder 441 and 453.

Figure 10:
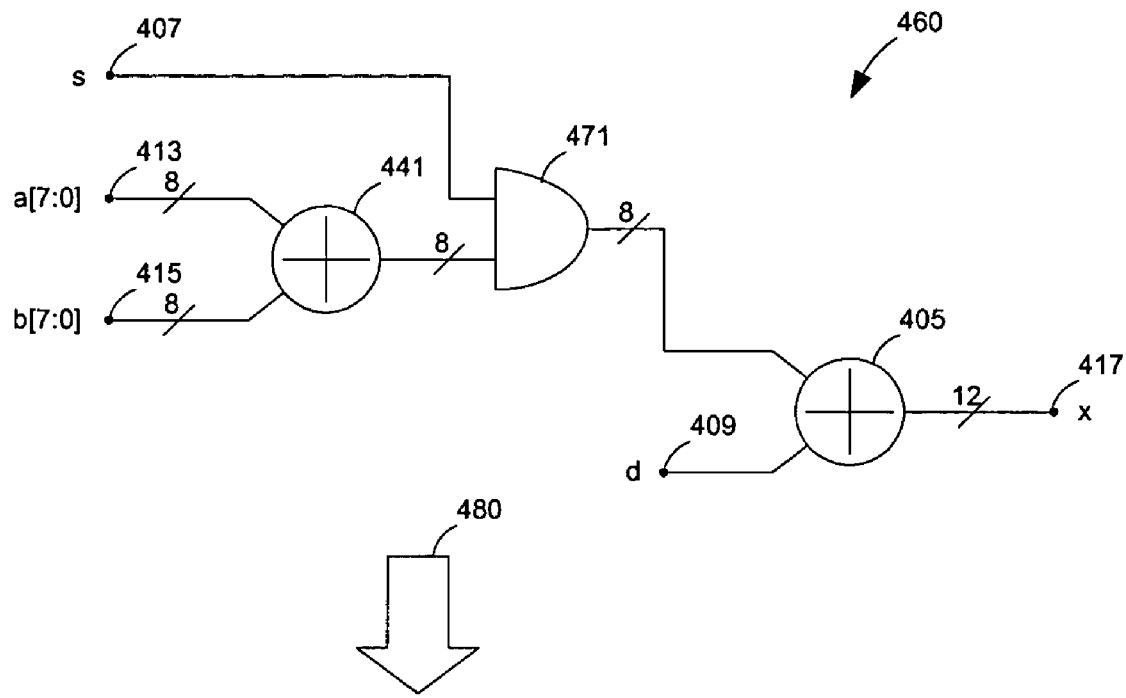
FIG. 10 shows a synthesis transformation of moving a logic element to allow the collapse of adders for carry save optimization according to one embodiment of the present invention.
Figure 10:
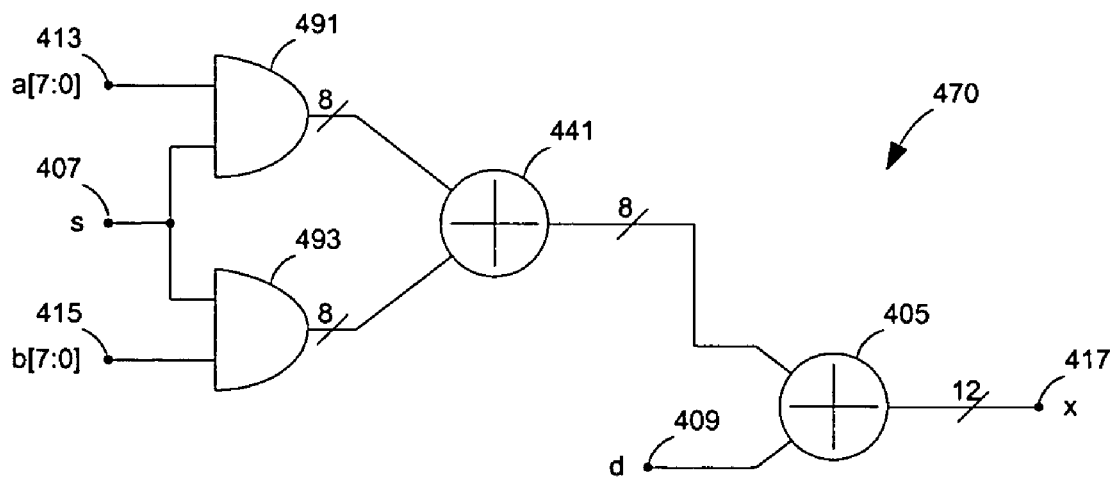

FIG. 10 shows a synthesis transformation of moving a logic element to allow the collapse of adders for carry save optimization according to one embodiment of the present invention. In FIG. 10, transformation 480 moves logic operator 471 backward across adder 441. Operation 471 is a degenerated multiplexer, which selects 0 when signal s 407 is 0 and selects the output of adder 441 when signal s 407 is 1. Since adder 441 may truncate output, correction inputs can be added to correct the dropped truncation after the collapsing of adder 441 and 404.

Figure 11:
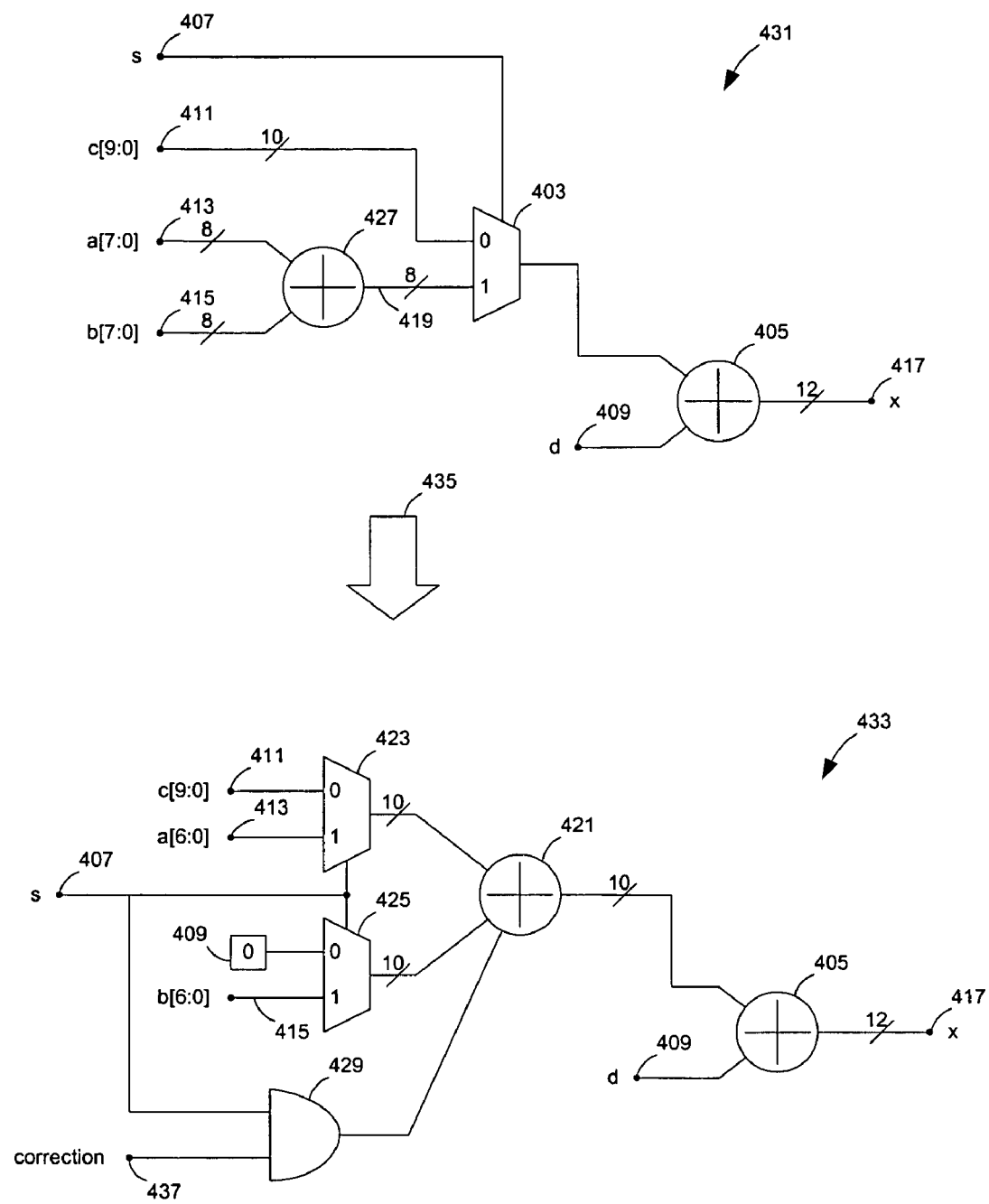
FIG. 11 shows a synthesis transformation of moving a multiplexer backward across a truncating adder to allow the collapse of adders for carry save optimization according to one embodiment of the present invention.

FIG. 11 shows a synthesis transformation of moving a multiplexer backward across a truncating adder to allow the collapse of adders for carry save optimization according to one embodiment of the present invention. In FIG. 11, eight-bit adder 427 of circuit 431 may truncate the result of adding a[7:0] (413) and b[7:0] (415). After synthesis transformation 435, adder 421 is promoted to ten-bit wide, which does not truncate at bit 8. Thus, the truncation in adder 427 may be dropped in adder 421 if not corrected. To correct the dropped truncation, correction input 437 is automatically generated from a[7:0] (413) and b[7:0] (415) (e.g., using circuit illustrated in FIG. 5 for unsigned number or FIG. 7 for signed number).

Although FIG. 11 shows a transformation example of splitting input c[9:0] of circuit 431 into input c[9:0] for multiplexer 423 and 0 for multiplexer 425 in circuit 410, it is understood that various different variations of splitting input c[9:0] of circuit 431 to generate the corresponding inputs for multiplexers 423 and 425 can be used. If the sum of the corresponding inputs for multiplexers 423 and 425 is equal to c[9:0] when s=0, adder 421 produces the same result as multiplexer 403. For example, if c[9:0] is the result of another adder which adds u[9:0] and v[9:0], u[9:0] and v[9:0] can be directly used as input for multiplexers 423 and 425, which are selected when s=0, so that this adder can be eliminated. In FIG. 11, multiplexer 425 and constant 409 can also be degenerated as an AND operator under control of s 407.

Thus, when a synthesis transformation widens an adder so that the truncation of the original adder is dropped, the correction input can be added to the transformed adder to correct the dropped truncation. Note that a synthesis software program may also first widen an adder to prepare to the adder for further synthesis transformation.

Figure 12:
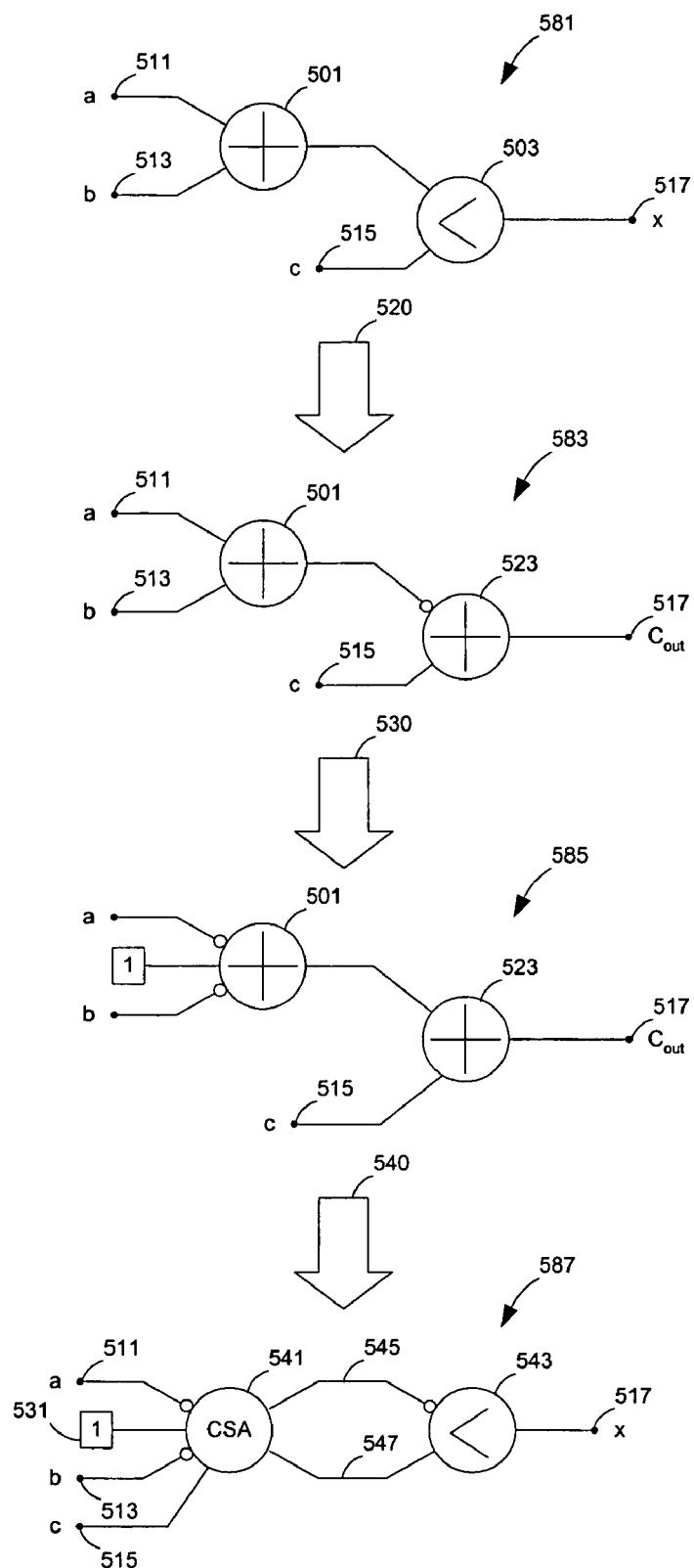
FIG. 12 shows a synthesis transformation for carry save optimization of a comparison operator following an adder according to one embodiment of the present invention.

FIG. 12 shows a synthesis transformation for carry save optimization of a comparison operator following an adder according to one embodiment of the present invention. In FIG. 12, adder 501 contains one carry chain in adding a (511) and b (513). Comparator 503 follows adder 501 to compare the output of adder 501 with c (515). Comparator 523 can be transformed (520) as adder 523. The carry out of adder 523 corresponds to the output of comparator 503. Transformation 530 pushes the inverse operator backward across adder 501 so that adders 501 and 523 can be collapsed into one for carry save optimization. Transformation 540 collapses adder 501 and 523 so that carry save adder 541 sums constant 1 (531), c (515), inverse of a (511) and inverse of b (513) to generate two outputs 545 and 547 without a carry chain. Comparator 543 generates the equivalent output. Thus, after the transformation from circuit 581 and 587, one carry chain is eliminated.

In the scenario of transformation illustrated in FIG. 12, it is assumed that adder 501 does not truncate output. However, when adder 501 truncates output while carry save adder 541 is widened (e.g., to accommodate input c 515), correction input can be added to carry save adder 541 to correct the dropped truncation in carry save adder 541.

In FIG. 12, there are no operators (e.g., multiplexer, XOR, AND, OR) between adder 501 and comparator 503. When there is a logic operator between the adder and the comparator, the logic operator can be pushed through the adder or the comparator so that the optimization as shown in FIG. 12 can be applied.

Figure 13:
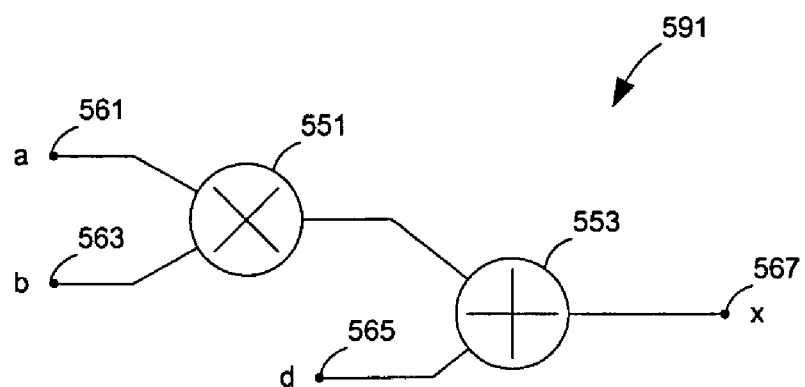
FIG. 13 shows a synthesis transformation for carry save optimization of an adder following a multiplier according to one embodiment of the present invention.
Figure 13:
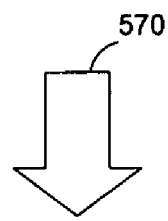
Figure 13:
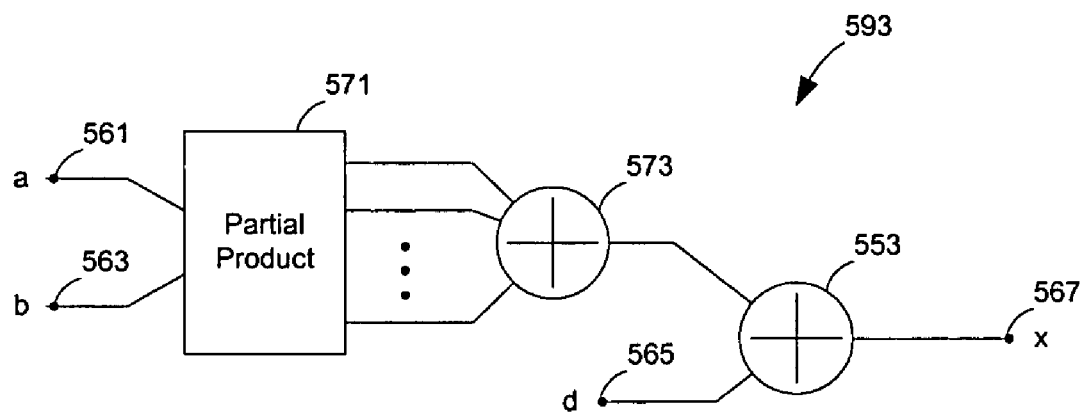

FIG. 13 shows a synthesis transformation for carry save optimization of an adder following a multiplier according to one embodiment of the present invention. In FIG. 13, circuit 591 contains multiplier 551. Multiplier 551 can be implemented using partial product 571 and final adder 573. Thus, after transformation 570, adder 553 that follows the multiplier can be collapsed with final adder 573 of the multiplier for carry save optimization. Boolean analyses may be used to determine whether or not the collapsing of the adder needs correction for dropped truncation.

Figure 14:
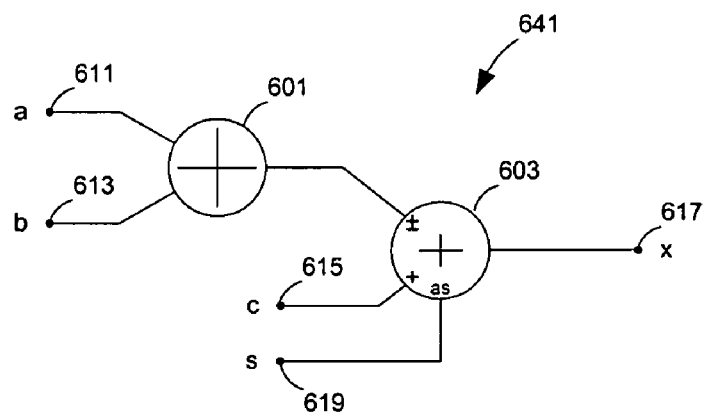
FIG. 14 shows a synthesis transformation for carry save optimization of an adder/subtractor following an adder according to one embodiment of the present invention.
Figure 14:
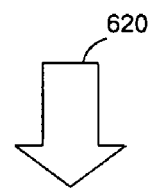
Figure 14:
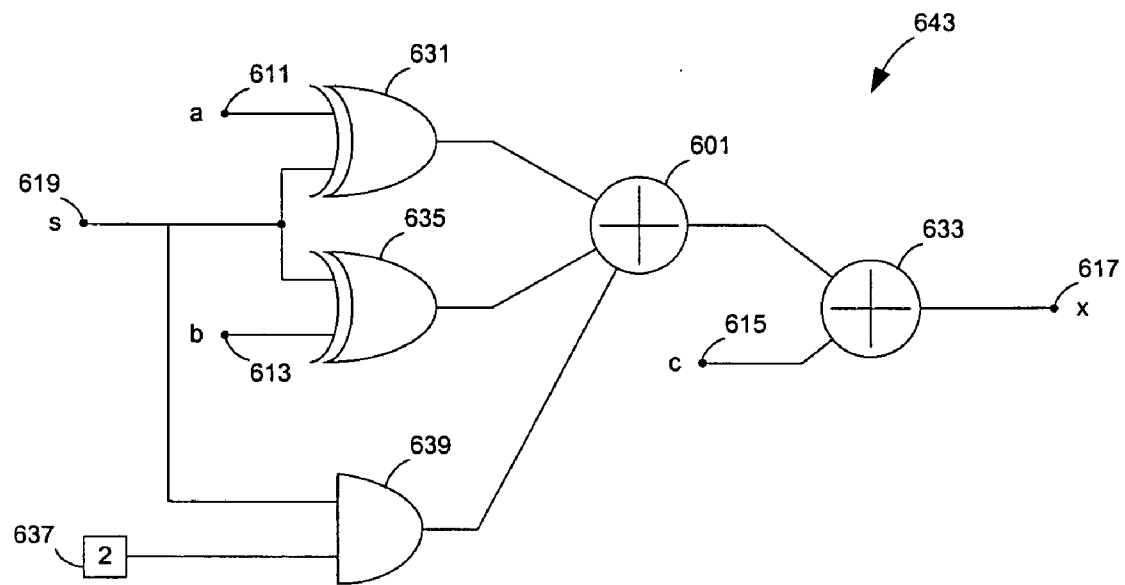

FIG. 14 shows a synthesis transformation for carry save optimization of an adder/subtractor following an adder according to one embodiment of the present invention. In FIG. 14, circuit 641 contains operation 603 which adds or subtracts the output of adder 601 to or from c (615) according to the value of s (619). After transformation 620, the conditional selection is performed at XOR 631 and XOR 635 so that adder 601 and 633 can be collapsed into one for carry save optimization. Note that in FIG. 14, operator 603 under control of s (619) is equivalent to an XOR controlled by s (619) followed by an adder. When the XOR is pushed over adder 601, circuit 643 is generated. Note that constant 637 is generated when the XOR is pushed through adder 601, since $-(A+B)=(\sim A)+(\sim B)+2$.

Boolean analysis can be performed to determine whether truncation may be dropped after promoting the width of an adder. When truncation may be dropped after promoting the width of an adder, the correction input as illustrated in FIGS. 5 and 7 can be used to correct the dropped truncation.

Figure 15:
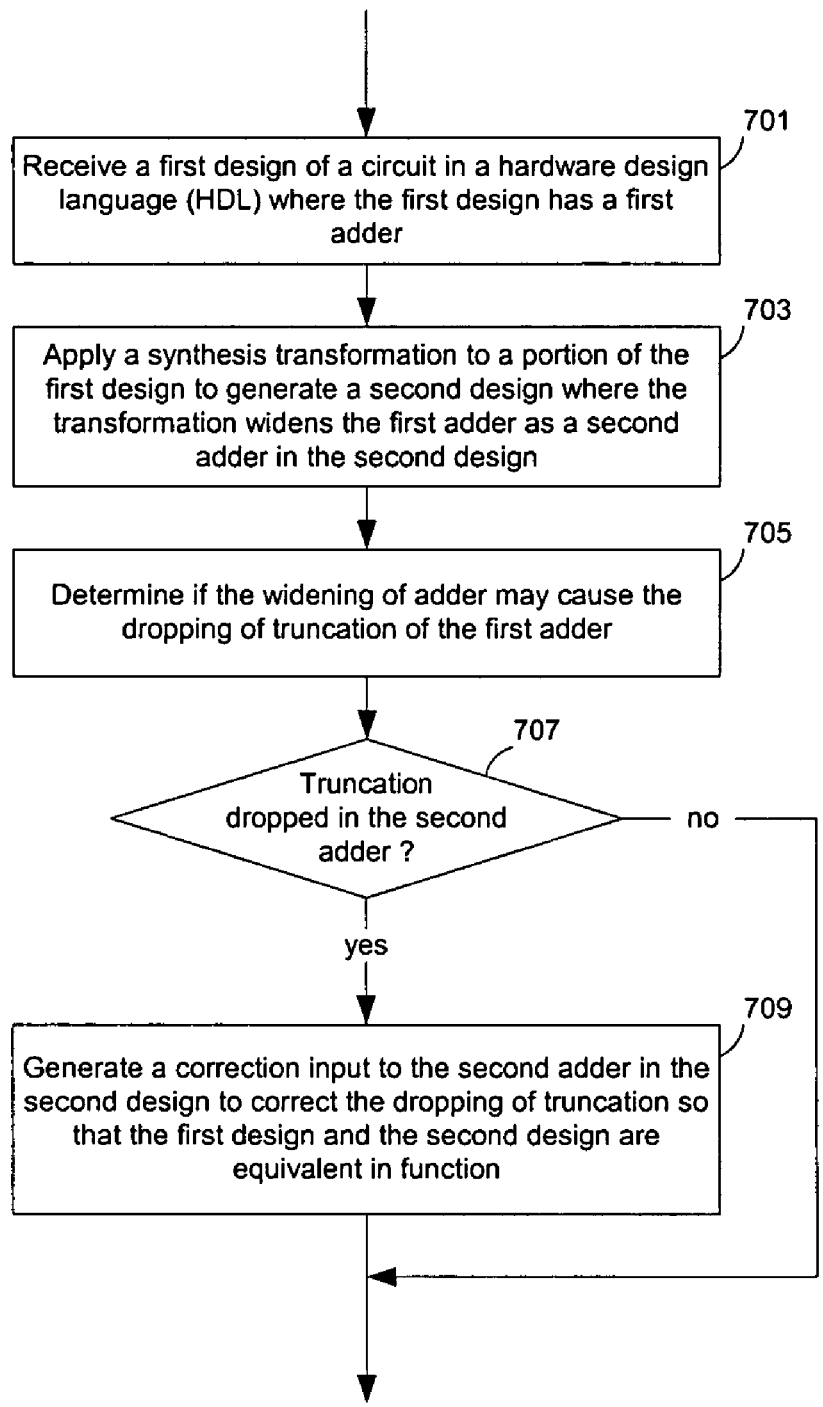
FIG. 15 shows a flow chart example of correcting dropped truncation in a widened adder according to one embodiment of the present invention.

FIG. 15 shows a flow chart example of correcting dropped truncation in a widened adder according to one embodiment of the present invention. After operation 701 receives a first design of a circuit in a hardware design language (HDL) where the first design has a first adder, operation 703 applies a synthesis transformation to a portion of the first design to generate a second design where the transformation widens the first adder as a second adder in the second design. Operation 705 determines if the widening of adder may cause the dropping of truncation of the first adder. The determination may be through a Boolean analysis or through a simulation or through the tracking of the synthesis transformation history. If operation 707 determines that truncation may be dropped in the second adder, operation 709 generates a correction input to the second adder in the second design to correct the dropping of truncation so that the first design and the second design are equivalent in function. For example, in FIG. 11, pushing multiplexer 403 through adder 427 widens the adder, which can cause the drop of truncation by adder 427. Thus, correction input (e.g., 437 and 429) is added to correct the dropping of truncation.

Further, for example, collapsing the adders for carry save optimization can also lead to the widening of an adder that may truncate output (e.g., in FIG. 3). Note that the width of any adder may also be widened for the subsequent syntheses transformation.

Figure 16:
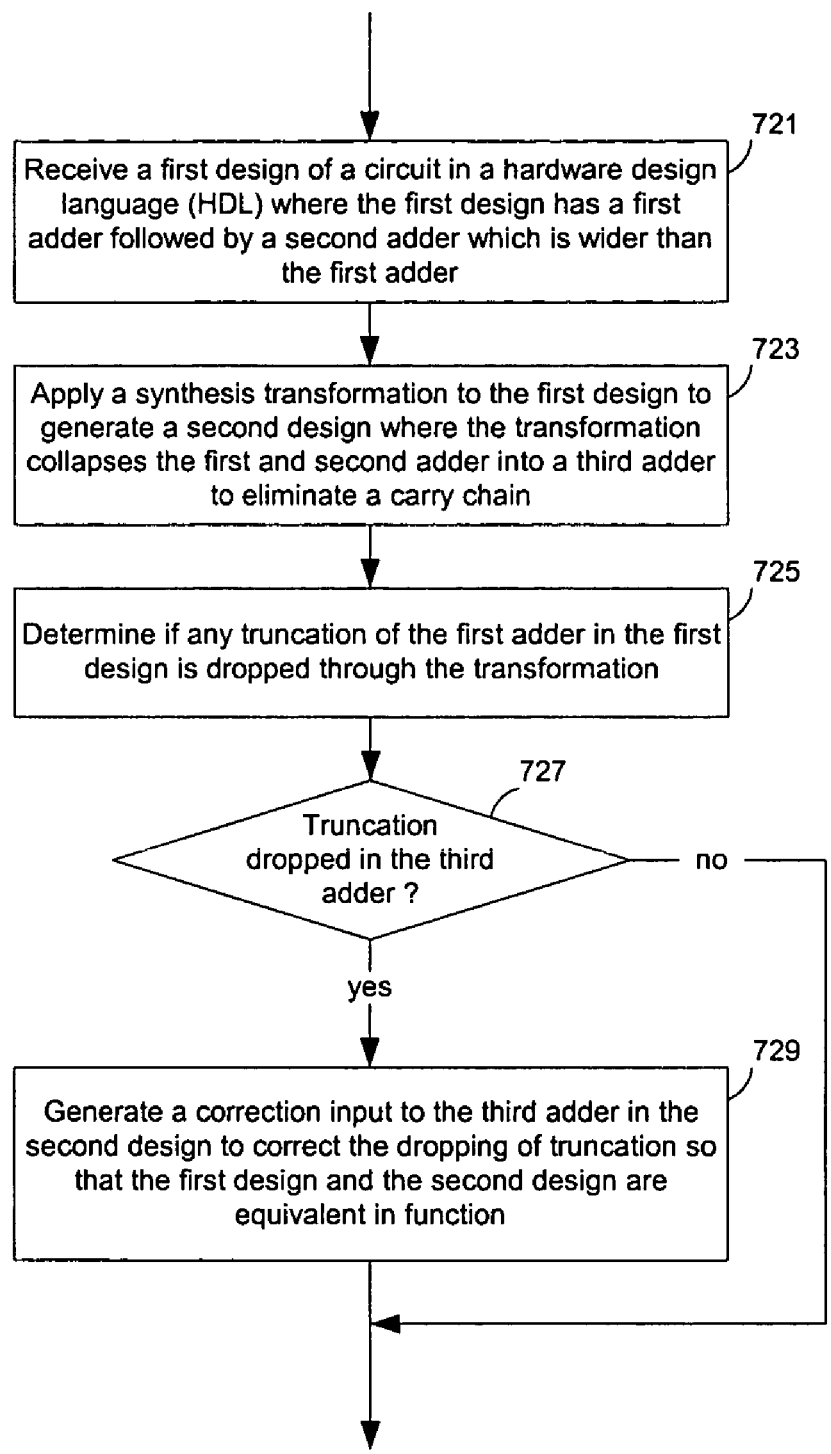
FIG. 16 shows a flow chart example of collapsing adders for carry save optimization according to one embodiment of the present invention.

FIG. 16 shows a flow chart example of collapsing adders for carry save optimization according to one embodiment of the present invention. After operation 721 receives a first design of a circuit in a hardware design language (HDL) where the first design has a first adder followed by a second adder which is wider than the first adder, operation 723 applies a synthesis transformation to the first design to generate a second design where the transformation collapses the first and second adder into a third adder to eliminate a carry chain. Operation 725 determines if any truncation of the first adder in the first design is dropped through the transformation. If operation 727 determines that truncation may be dropped in the third adder, operation 729 generates a correction input to the third adder in the second design to correct the dropping of truncation so that the first design and the second design are equivalent in function. The correction input can be generated from the input for the first adder, as illustrated in FIG. 5 for unsigned numbers or FIG. 7 for signed numbers.

Figure 17:
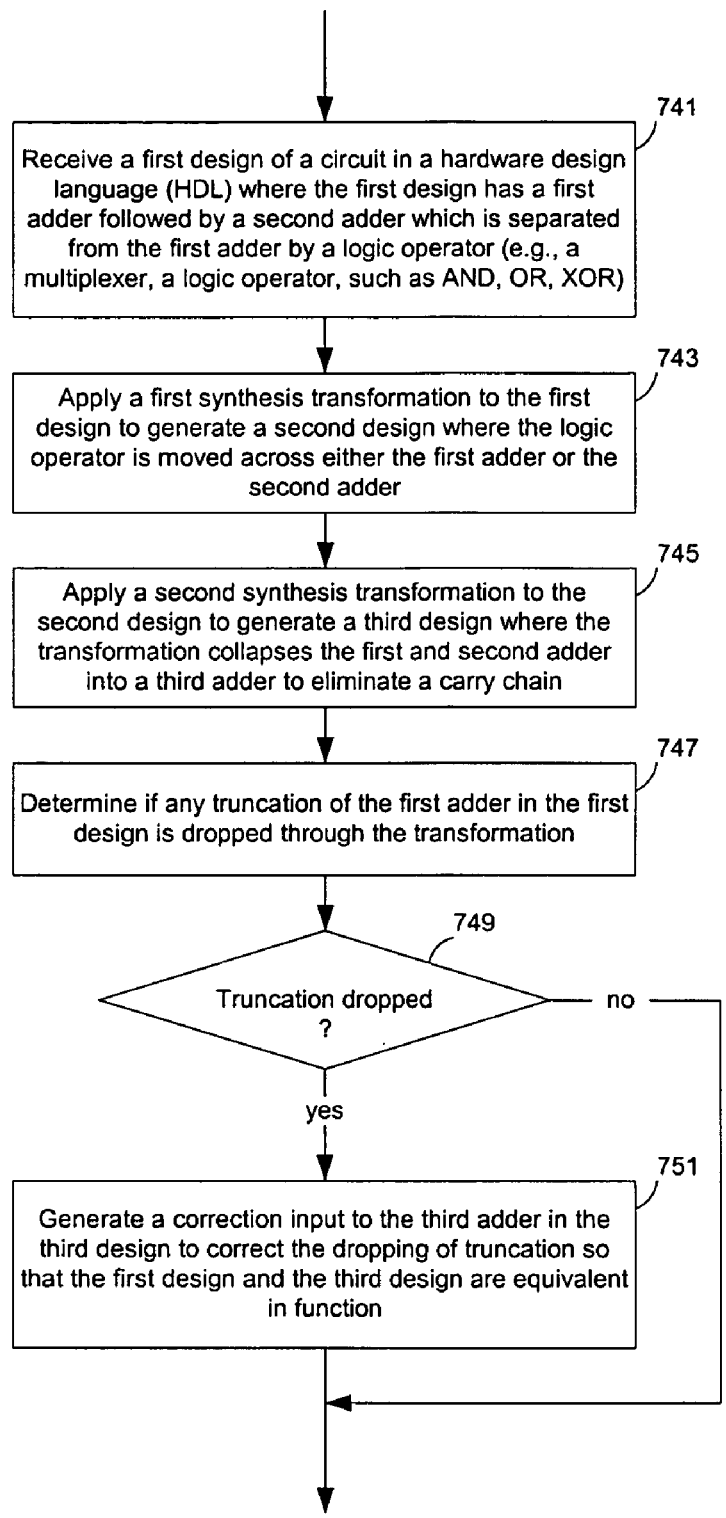
FIG. 17 shows a flow chart example of pushing logic operators through adders for collapsing adders according to one embodiment of the present invention.

FIG. 17 shows a flow chart example of pushing logic operators through adders for collapsing adders according to one embodiment of the present invention. After operation 741 receive a first design of a circuit in a hardware design language (HDL) where the first design has a first adder followed by a second adder which is separated from the first adder by a logic operator (e.g., a multiplexer, a logic operator, such as AND, OR, XOR), operation 743 applies a first synthesis transformation to the first design to generate a second design where the logic operator is moved across either the first adder or the second adder. Operation 745 then applies a second synthesis transformation to the second design to generate a third design where the transformation collapses the first and second adder into a third adder to eliminate a carry chain. Operation 747 determines if any truncation of the first adder in the first design is dropped through the transformation. If operation 749 determines that truncation may be dropped for certain input data, operation 751 generates a correction input to the third adder in the third design to correct the dropping of truncation so that the first design and the third design are equivalent in function.

Figure 18:
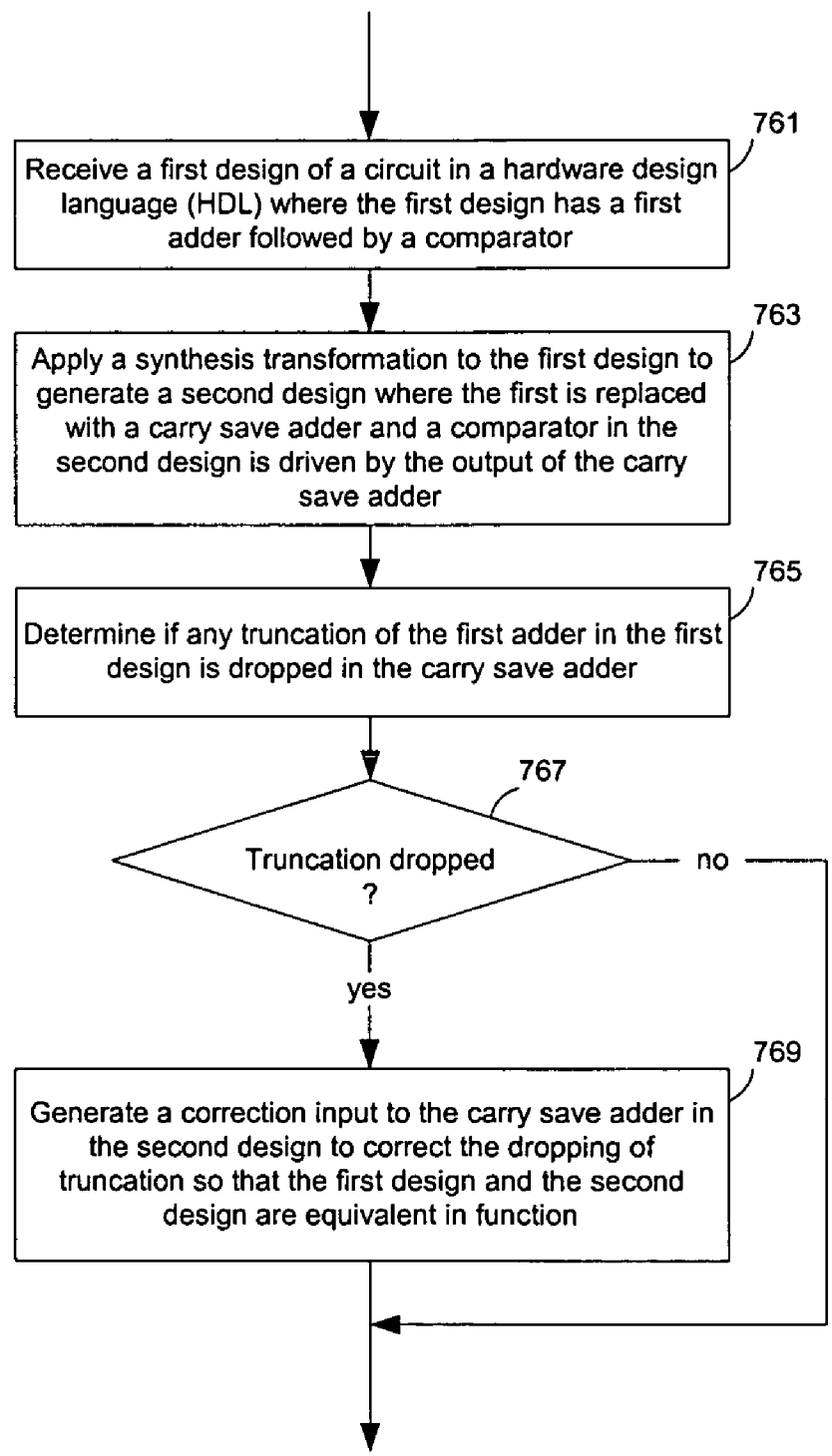
FIG. 18 shows a flow chart example of transforming a circuit with an adder followed by a comparator to eliminate a carry chain in the adder according to one embodiment of the present invention.

FIG. 18 shows a flow chart example of transforming a circuit with an adder followed by a comparator to eliminate a carry chain in the adder according to one embodiment of the present invention. After operation 761 receives a first design of a circuit in a hardware design language (HDL) where the first design has a first adder followed by a comparator, operation 763 applies a synthesis transformation to the first design to generate a second design where the first is replaced with a carry save adder and a comparator in the second design is driven by the output of the carry save adder. Operation 765 determines if any truncation of the first adder in the first design is dropped in the carry save adder. If operation 767 determines that truncation may be dropped for certain input data, operation 769 generates a correction input to the carry save adder in the second design to correct the dropping of truncation so that the first design and the second design are equivalent in function.

While most embodiments of the present invention are intended for use in an HDL design synthesis software, the invention is not necessarily limited to such use. Although use of other languages and computer programs is possible (e.g. a computer program may be written to describe hardware and thus be considered an expression in an HDL and may be compiled or the invention, in some embodiments, may allocate and reallocate a logic representation, e.g. a netlist, which was created without the use of an HDL), embodiments of the present invention will be described in the context of use in HDL synthesis systems, and particularly those designed for use with integrated circuits which have vendor-specific technology/architectures. As is well known, the target architecture is typically determined by a supplier of programmable ICs. An example of a target architecture is the programmable lookup tables (LUTs) and associated logic of the integrated circuits which are field programmable gate arrays from Xilinx, Inc. of San Jose, Calif. Other examples of target architecture/technology include those well known architectures in field programmable gate arrays and complex programmable logic devices from vendors such as Altera, Lucent Technology, Advanced Micro Devices, and Lattice Semiconductor. For certain embodiments, the present invention may also be employed with application-specific integrated circuits (ASICs).

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A machine implemented method of automated design of a circuit, the method comprising:
   performing a synthesis transformation on a hardware design language (HDL) representation of a circuit to widen an adder;
   determining whether or not the widened adder drops any truncation that is performed before the adder is widened; and
   automatically generating a correction input to the widened adder to correct dropping of truncation.

2. The method of claim 1, wherein the synthesis transformation comprises:
   pushing a logic operator backward through the adder.

3. The method of claim 1, wherein the synthesis transformation comprises:
   transforming the adder into a carry save adder in combination with a down stream adder.

4. The method of claim 1, wherein the synthesis transformation comprises:
   combining the adder with a down stream element to generate a carry save adder to eliminate at least one carry chain.

5. The method of claim 4, wherein the down stream element comprises one of:
   an adder;
   a comparator; and
   an adder/subtractor.

6. The method of claim 4, wherein the synthesis transformation further comprises:
   transforming a multiplier to generate the adder.

7. The method of claim 4, wherein the synthesis transformation further comprises:
   pushing an logic operator from between the adder and the down stream element to outside a path between the adder and the down stream element.

8. A machine implemented method of automated design of a circuit, the method comprising:
   receiving a hardware design language (HDL) representation of a circuit, the HDL representation of the circuit having a first adder followed by a first comparator;
   transforming the HDL representation of the circuit to replace the first adder and the first comparator with a second carry save adder and a second comparator, the second comparator being driven by two outputs of the second carry save adder;
   determining whether or not the second carry save adder drops any truncation that is performed before said transforming; and
   automatically generating a correction input to correct dropping of truncation in the second carry save adder.

9. The method of claim 8, wherein the second comparator is the same as the first comparator.

10. The method of claim 8, further comprising:
    pushing a logic operator from between the first adder and the first comparator to outside the first adder and the first comparator.

11. The method of claim 8, further comprising:
    automatically generating a circuit to compute a correction as an input for the second carry save adder to correct dropping of truncation;
    wherein the first adder has a first width;
    the second carry save adder has a second width;
    the first width is smaller than the second width; and
    the correction corrects the dropping of truncation caused by promoting inputs for the first adder of the first width to inputs for the second carry save adder of the second width.

12. A machine implemented method of automated design of a circuit in a hardware design language (HDL) representation, the method comprising:
    transforming a portion of a circuit from a first design to a second design containing a carry save adder to eliminate at least one carry chain; and
    automatically generating a correction circuit to compute a correction input for the carry save adder in the second design to maintain equivalence between the first design of the portion of the circuit and the second design of the portion of the circuit;
    wherein the first design comprises a first adder of a first width; the carry save adder has a second width; the first width is smaller than the second width; the correction corrects dropping of truncation caused by promoting inputs for the first adder of the first width to inputs for the carry save adder of the second width.

13. The method of claim 12, wherein the correction corrects dropping of truncation of summing two signed or unsigned integers.

14. The method of claim 12, wherein the first design comprises a first element connected to a second element, the first element having one carry chain, the second element having one carry chain; the second design element uses the carry save adder to eliminate at least one of the carry chain of the first element and the carry chain of the second element.

15. The method of claim 14, wherein the correction circuit combines a portion of inputs for the first element to compute the correct as an input for the carry save adder.

16. A machine readable medium containing executable computer program instructions which when executed by a data processing system cause said system to perform a method of automated design of a circuit, the method comprising:

performing a synthesis transformation on a hardware design language (HDL) representation of a circuit to widen an adder;

determining whether or not the widened adder drops any truncation that is performed before the adder is widened; and automatically generating a correction input to the widened adder to correct dropping of truncation.

17. The medium of claim 16, wherein the synthesis transformation comprises:

pushing a logic operator backward through the adder.

18. The medium of claim 16, wherein the synthesis transformation comprises:

transforming the adder into a carry save adder in combination with a down stream adder.

19. The medium of claim 16, wherein the synthesis transformation comprises:

combining the adder with a down stream element to generate a carry save adder to eliminate at least one carry chain.

20. The medium of claim 19, wherein the down stream element comprises one of:

an adder;

a comparator; and an adder/subtractor.

21. The medium of claim 19, wherein the synthesis transformation further comprises:

transforming a multiplier to generate the adder.

22. The medium of claim 19, wherein the synthesis transformation further comprises:

pushing an logic operator from between the adder and the down stream element to outside a path between the adder and the down stream element.

23. A machine readable medium containing executable computer program instructions which when executed by a data processing system cause said system to perform a method of automated design of a circuit, the method comprising:

receiving a hardware design language (HDL) representation of a circuit, the HDL representation of the circuit having a first adder followed by a first comparator;

transforming the HDL representation of the circuit to replace the first adder and the first comparator with a second carry save adder and a second comparator, the second comparator being driven by two outputs of the second carry save adder;

determining whether or not the second carry save adder drops any truncation that is performed before said transforming; and automatically generating a correction input to correct dropping of truncation in the second carry save adder.

24. The medium of claim 23, wherein the second comparator is the same as the first comparator.

25. The medium of claim 23, wherein the method further comprises:

pushing a logic operator from between the first adder and the first comparator to outside the first adder and the first comparator.

26. The medium of claim 23, wherein the method further comprises:

automatically generating a circuit to compute a correction as an input for the second carry save adder to correct dropping of truncation;

wherein the first adder has a first width;

the second carry save adder has a second width;

the first width is smaller than the second width; and the correction corrects the dropping of truncation caused by promoting inputs for the first adder of the first width to inputs for the second carry save adder of the second width.

27. A machine readable medium containing executable computer program instructions which when executed by a data processing system cause said system to perform a method of automated design of a circuit in a hardware design language (HDL) representation, the method comprising:

transforming a portion of a circuit from a first design to a second design containing a carry save adder to eliminate at least one carry chain; and automatically generating a correction circuit to compute a correction input for the carry save adder in the second design to maintain equivalence between the first design of the portion of the circuit and the second design of the portion of the circuit;

wherein the first design comprises a first adder of a first width; the carry save adder has a second width; the first width is smaller than the second width; the correction corrects dropping of truncation caused by promoting inputs for the first adder of the first width to inputs for the carry save adder of the second width.

28. The medium of claim 27, wherein the correction corrects dropping of truncation of summing two signed or unsigned integers.

29. The medium of claim 27, wherein the first design comprises a first element connected to a second element, the first element having one carry chain, the second element having one carry chain; the second design element uses the carry save adder to eliminate at least one of the carry chain of the first element and the carry chain of the second element.

30. The medium of claim 29, wherein the correction circuit combines a portion of inputs for the first element to compute the correct as an input for the carry save adder.

31. A data processing system to implement automated design of a circuit, the system comprising:

means for performing a synthesis transformation on a hardware design language (HDL) representation of a circuit to widen an adder;

means for determining whether or not the widened adder drops any truncation that is performed before the adder is widened; and means for automatically generating a correction input to the widened adder to correct dropping of truncation.

32. The system of claim 31, wherein means for performing the synthesis transformation comprises:

means for pushing a logic operator backward through the adder.

33. The system of claim 31, wherein means for performing the synthesis transformation comprises:

means for transforming the adder into a carry save adder in combination with a down stream adder.

34. The system of claim 31, wherein means for performing the synthesis transformation comprises:

means for combining the adder with a down stream element to generate a carry save adder to eliminate at least one carry chain.

35. The system of claim 34, wherein the down stream element comprises one of:

an adder;

a comparator; and an adder/subtractor.

36. The system of claim 34, wherein means for performing the synthesis transformation further comprises:

means for transforming a multiplier to generate the adder.

37. The system of claim 34, wherein means for performing the synthesis transformation further comprises:

means for pushing an logic operator from between the adder and the down stream element to outside a path between the adder and the down stream element.

38. A data processing system to implement automated design of a circuit, the system comprising:

means for receiving a hardware design language (HDL) representation of a circuit, the HDL representation of the circuit having a first adder followed by a first comparator;

means for transforming the HDL representation of the circuit to replace the first adder and the first comparator with a second carry save adder and a second comparator, the second comparator being driven by two outputs of the second carry save adder;

means for determining whether or not the second carry save adder drops any truncation that is performed before said transforming; and means for automatically generating a correction input to correct dropping of truncation in the second carry save adder.

39. The system of claim 38, wherein the second comparator is the same as the first comparator.

40. The system of claim 38, further comprising:

means for pushing a logic operator from between the first adder and the first comparator to outside the first adder and the first comparator.

41. The system of claim 38, further comprising:

means for automatically generating a circuit to compute a correction as an input for the second carry save adder to correct dropping of truncation;

wherein the first adder has a first width;

the second carry save adder has a second width;

the first width is smaller than the second width; and the correction corrects the dropping of truncation caused by promoting inputs for the first adder of the first width to inputs for the second carry save adder of the second width.

42. A data processing system to implement automated design of a circuit in a hardware design language (HDL) representation, the system comprising:

means for transforming a portion of a circuit from a first design to a second design containing a carry save adder to eliminate at least one carry chain; and means for automatically generating a correction circuit to compute a correction input for the carry save adder in the second design to maintain equivalence between the first design of the portion of the circuit and the second design of the portion of the circuit;

wherein the first design comprises a first adder of a first width; the carry save adder has a second width; the first width is smaller than the second width; the correction corrects dropping of truncation caused by promoting inputs for the first adder of the first width to inputs for the carry save adder of the second width.

43. The system of claim 42, wherein the correction corrects dropping of truncation of summing two signed or unsigned integers.

44. The system of claim 42, wherein the first design comprises a first element connected to a second element, the first element having one carry chain, the second element having one carry chain; the second design element uses the carry save adder to eliminate at least one of the carry chain of the first element and the carry chain of the second element.

45. The system of claim 44, wherein the correction circuit combines a portion of inputs for the first element to compute the correct as an input for the carry save adder.

* * * * *